(12) United States Patent
Kikuchi

(10) Patent No.: US 12,422,472 B2
(45) Date of Patent: Sep. 23, 2025

(54) TEMPERATURE CONTROL DEVICE, ELECTRONIC COMPONENT HANDLING APPARATUS, ELECTRONIC COMPONENT TEST APPARATUS, AND DUT TEMPERATURE CONTROL METHOD

(71) Applicant: ADVANTEST Corporation, Tokyo (JP)

(72) Inventor: Aritomo Kikuchi, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 18/091,814

(22) Filed: Dec. 30, 2022

(65) Prior Publication Data

US 2023/0314500 A1 Oct. 5, 2023

(30) Foreign Application Priority Data

Mar. 31, 2022 (JP) ................................ 2022-058828

(51) Int. Cl.
*G01R 31/28* (2006.01)
(52) U.S. Cl.
CPC ...... *G01R 31/2877* (2013.01); *G01R 31/2865* (2013.01)
(58) Field of Classification Search
CPC .......................... G01R 31/2874; G01R 1/0458; G01R 1/0466; G01R 31/2891; G01R 31/2865; G01R 31/2887; G01R 31/2806; G01R 31/2863; G01R 31/2875; G01R 31/31905; G01R 31/2877; G06F 2113/08; G06F 2119/02; F16K 11/07; F16K 3/04
See application file for complete search history.

(56) References Cited

U.S. PATENT DOCUMENTS

| 4,982,153 A | * | 1/1991 | Collins | .............. | G01R 31/2817 |
| | | | | | 279/3 |
| 6,668,570 B2 | * | 12/2003 | Wall | .................... | G01R 31/2874 |
| | | | | | 62/211 |
| 8,040,145 B2 | * | 10/2011 | Kabbani | ................. | F28F 3/086 |
| | | | | | 324/750.09 |
| 8,653,843 B2 | * | 2/2014 | Ando | ................. | G01R 31/2874 |
| | | | | | 324/750.04 |

(Continued)

FOREIGN PATENT DOCUMENTS

| CN | 1537217 A | 10/2004 |
| JP | 2007-534937 A | 11/2007 |

(Continued)

OTHER PUBLICATIONS

Office Action issued in corresponding Taiwanese Patent Application No. 111146939 (5 pages).

(Continued)

*Primary Examiner* — Vinh P Nguyen
(74) *Attorney, Agent, or Firm* — Osha Bergman Watanabe & Burton LLP

(57) ABSTRACT

A temperature control device controls a temperature of a device under test (DUT) including a device flow path in testing the DUT, and includes: a first flow path that has a first connection port to be connected to an inlet of the device flow path; and a fluid supply system that is connected to the first flow path and supplies a first fluid for temperature control to the device flow path.

16 Claims, 14 Drawing Sheets

(56) References Cited

U.S. PATENT DOCUMENTS

| | | | |
|---|---|---|---|
| 10,753,971 B2 * | 8/2020 | Saito | G01R 31/2875 |
| 11,061,067 B2 * | 7/2021 | Wu | G01R 31/2849 |
| 11,181,576 B2 * | 11/2021 | Kato | G01R 31/2891 |
| 11,828,795 B1 * | 11/2023 | Jones | G01R 31/2817 |
| 11,899,477 B2 * | 2/2024 | Barros | G05D 7/0658 |
| 2003/0217558 A1 | 11/2003 | Wall et al. | |
| 2004/0139756 A1 | 7/2004 | Wall et al. | |
| 2005/0189342 A1 | 9/2005 | Kabbani | |
| 2005/0224492 A1 | 10/2005 | Roy | |
| 2006/0114013 A1 | 6/2006 | Kabbani | |
| 2010/0066399 A1 | 3/2010 | Kabbani | |
| 2010/0224352 A1 | 9/2010 | Stuckey et al. | |
| 2016/0377658 A1 | 12/2016 | Diglio et al. | |
| 2019/0101587 A1 | 4/2019 | Watanabe | |
| 2019/0302178 A1 | 10/2019 | Saito | |
| 2020/0033402 A1 | 1/2020 | Hashimoto et al. | |
| 2020/0241040 A1 | 7/2020 | Yoshino et al. | |
| 2020/0241582 A1 | 7/2020 | Sasaki et al. | |

FOREIGN PATENT DOCUMENTS

| | | | |
|---|---|---|---|
| JP | 4994842 B2 | 8/2012 | |
| KR | 101047832 B1 | 7/2011 | |
| TW | 201701384 A | 1/2017 | |

OTHER PUBLICATIONS

Office Action issued in corresponding Taiwanese Patent Application No. 111146939 mailed May 13, 2024 (5 pages).

* cited by examiner

TEMPERATURE CONTROL DEVICE, ELECTRONIC COMPONENT HANDLING APPARATUS, ELECTRONIC COMPONENT TEST APPARATUS, AND DUT TEMPERATURE CONTROL METHOD

CROSS-REFERENCE TO RELATED APPLICATIONS

The present application claims priority from Japanese Patent Application No. 2022-058828 filed on Mar. 31, 2022, the contents of which are incorporated herein by reference in their entirety.

BACKGROUND

Technical Field

The present invention relates to a temperature control device that controls a temperature of an electronic component under test (DUT: Device Under Test) such as a semiconductor integrated circuit device, an electronic component handling apparatus and an electronic component test apparatus including the temperature control device, and a DUT temperature control method using the temperature control device.

Description of Related Art

There is known a technique for controlling the temperature of a DUT by supplying liquid to a flow path of a heat exchanger provided in a contact chuck that holds the DUT (refer to, for example, Patent Document 1)).

PATENT DOCUMENT

Patent Document 1: US 2019/0302178 A1

According to the above technique, it is difficult to efficiently cool the DUT because inclusions between the fluid flowing in the flow path and the die of the DUT act as thermal resistance.

SUMMARY

One or more embodiments of the present invention provide a temperature control device capable of improving the cooling efficiency of the DUT, an electronic component handling apparatus and an electronic component test apparatus including the temperature control device, and a DUT temperature control method using the temperature control device.

[1] A temperature control device according to one or more embodiments is a temperature control device that controls a temperature of a device under test (DUT) at the time of testing the DUT, the DUT comprising a device flow path (channel) having an inlet and an outlet, and a die disposed in the device flow path, the temperature control device comprising: a first flow path having a first connection port to be connected to the inlet of the device flow path; and a fluid supply system connected to the first flow path and supplying a first fluid for temperature control to the device flow path.

[2] In one or more embodiments, the temperature control device may comprise: a second flow path having a second connection port to be connected to the outlet of the device flow path; and a purge system connected to the first and second flow paths and supplying a second fluid for purge to the device flow path.

[3] In one or more embodiments, the fluid supply system may comprise: a third flow path connected to the first flow path; a fourth flow path connected to the second flow path; a first valve disposed on the third flow path; and a second valve disposed on the fourth flow path, the purge system may comprise: a connection part to which a first supply source supplying the second fluid is to be connected; a fifth flow path connecting the connection part and the first flow path; a sixth flow path connected to the second flow path; a third valve disposed on the fifth flow path; and a fourth valve disposed on the sixth flow path, the fluid supply system may open the first and second valve to supply the first fluid to the device flow path in a state where the third and fourth valves are closed, and the purge system may open the third and fourth valve to supply the second fluid to the device flow path in a state where the first and second valves are closed.

[4] In one or more embodiments, the sixth flow path may be connected to the fluid supply system.

[5] In one or more embodiments, the purge system may open the third valve to supply the second fluid to the device flow path in a state where the first, second and fourth valves are closed when the first and second connection ports move away from the inlet and outlet.

[6] In one or more embodiments, the temperature control device may comprise: a pressure sensor that detects a pressure in the first flow path; and a determination device (i.e., a controller) that determines a first seal state between the inlet and the first connection port and a second seal state between the second connection port and the outlet based on the pressure value detected by the pressure sensor.

[7] In one or more embodiments, the fluid supply system may comprise: a third flow path connected to the first flow path; a fourth flow path connected to the second flow path; a first valve disposed on the third flow path; and a second valve disposed on the fourth flow path, the purge system may comprise: a connection part to which a first supply source supplying the second fluid is to be connected; a fifth flow path connecting the connection part and the first flow path; a sixth flow path connected to the second flow path; a third valve disposed on the fifth flow path; and a fourth valve disposed on the sixth flow path, the purge system may open the third valve to supply the second fluid in a state where the first, second and fourth valves are closed, and the determination device may determine the first and second seal state based on first and second pressure values obtained by the pressure sensor at different timings after the third valve is closed.

[8] In one or more embodiments, the fluid supply system may comprise: multiple first seal rings disposed to surround the first connection port; and multiple second seal rings disposed to surround the second connection port.

[9] In one or more embodiments, the first fluid may include: a third fluid; and a fourth fluid having a temperature different from a temperature of the third fluid, and the fluid supply system may comprise: a second supply source supplying the third fluid; and a third supply source supplying the fourth fluid.

[10] An electronic component handling apparatus (e.g., handler) according to one or more embodiments is an electronic component handling apparatus handling a DUT, the electronic component handling apparatus comprising: the temperature control device described above; and a pusher in which the first and second flow paths of the temperature control device are disposed and that contacts the DUT and presses the DUT against the socket.

[11] In one or more embodiments, the DUT may comprise: the die; a board on which the die is mounted; and a lid attached to the board to cover the die, the device flow path may be a space formed between the board and the lid, and the inlet and outlet may be formed in the lid.

[12] An electronic component test apparatus according to one or more embodiments is an electronic component test apparatus comprising: the electronic component handling apparatus described above; and a tester having a socket.

[13] An electronic component test apparatus according to one or more embodiments is an electronic component test apparatus comprising: the temperature control device described above; and a tester having a socket in which the first and second flow paths of the temperature control device are disposed; and an electronic component handling apparatus handling the DUT and pressing the DUT against the socket.

[14] A DUT temperature control method is a DUT temperature control method for controlling a temperature of a device under test (DUT) using the temperature control device described above, the DUT temperature control method comprising: a first step of connecting the first connection port to the inlet of the device flow path; and a second step of supplying the first fluid to the device flow path through the first flow path.

[15] In one or more embodiments, the temperature control device may comprise: a second flow path having a second connection port to be connected to the outlet of the device flow path; and a purge system connected to the first and second flow paths and supplying a second fluid for purge to the device flow path, the DUT temperature control method may comprise a third step of supplying the second fluid to the device flow path after stopping the supply of the first fluid.

[16] In one or more embodiments, the purge system may comprise: a connection part to which a first supply source supplying the second fluid is to be connected; a fifth flow path connecting the connection part and the first flow path; a sixth flow path connected to the second flow path; a third valve disposed on the fifth flow path; and a fourth valve disposed on the sixth flow path, and the DUT temperature control method may comprise a fourth step of opening the third valve to supply the second fluid to the device flow path in a state where the fourth valve is closed when the first and second connection ports move away from the inlet and outlet.

[17] In one or more embodiments, the temperature control device may comprise a pressure sensor that detects a pressure in the first flow path, and the DUT temperature control method may comprises: a fifth step of supplying the second fluid; a sixth step of detecting a first pressure value by the pressure sensor after stopping the supply of the second fluid; a seven step of detecting a second pressure value by the pressure sensor after the sixth step; and an eight step of determining a first seal state between the inlet and the first connection port and a second seal state between the second connection port and the outlet based on the first and second pressure values, the fifth to eight steps may be executed before the second step is executed, and when it is determined in the eighth step that the first and second seal state are secured, the second step may be executed.

According to the present invention, since the fluid supply system supplies the fluid for temperature control to the device flow path of the DUT through the first flow path thereby the first fluid directly contact with the die, it is possible to improve the efficiency of cooling the DUT.

DETAILED DESCRIPTION

Hereinafter, embodiments of the invention will be described with reference to the drawings.

Figure 1:
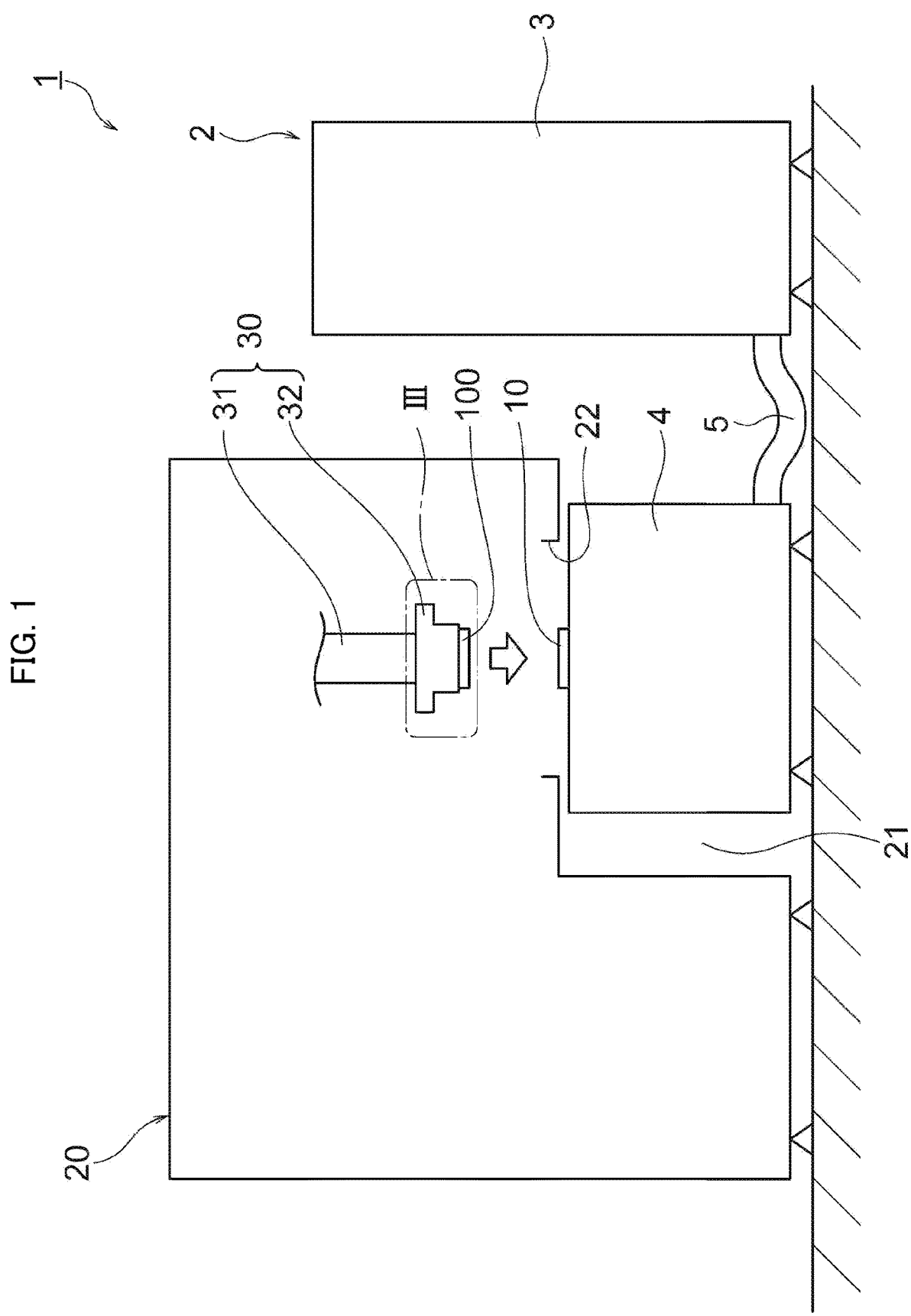
FIG. 1 is a schematic cross-sectional view showing the overall configuration of an electronic device test apparatus in a first embodiment of the present invention.
Figure 2A:
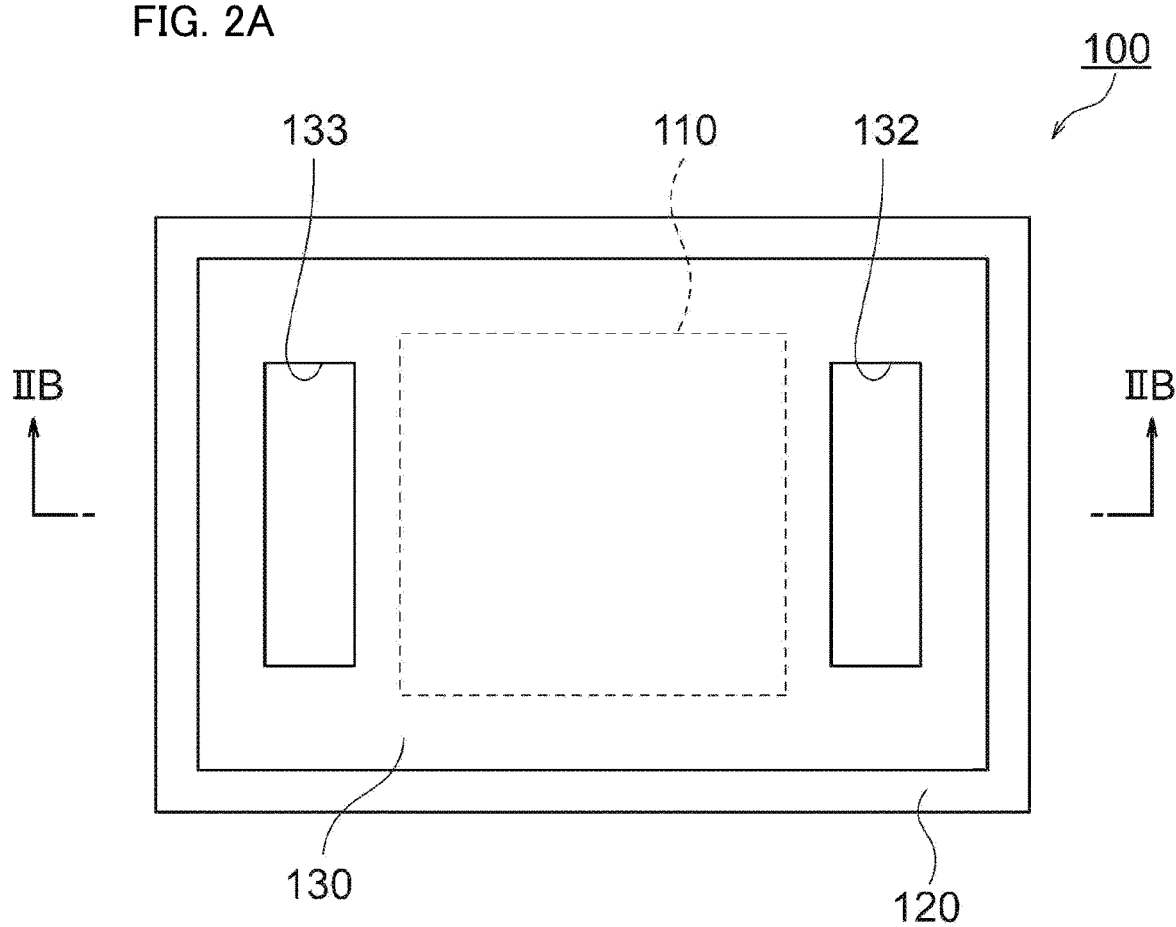
FIG. 2A is a plan view showing the DUT in the first embodiment of the present invention.
Figure 2B:
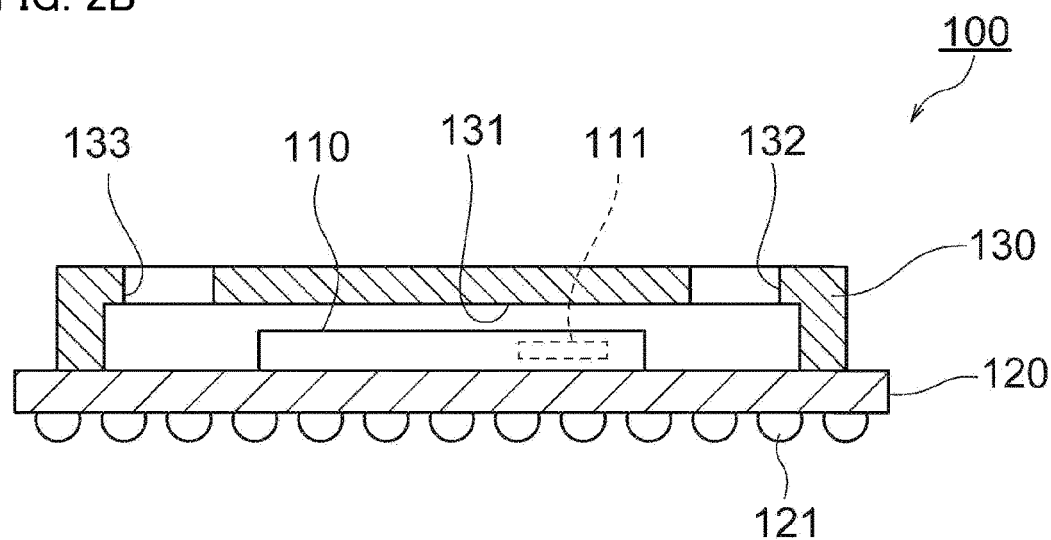
FIG. 2B is a cross-sectional view taken along line IIB-IIB in FIG. 2A.

FIG. 1 is a schematic cross-sectional view showing the overall configuration of an electronic device test apparatus 1 in a first embodiment of the present invention. FIG. 2A is a plan view showing the DUT in the first embodiment of the present invention, and FIG. 2B is a cross-sectional view taken along line IIB-IIB in FIG. 2A.

An electronic device test apparatus 1 of the first embodiment is an apparatus that tests electrical characteristics of a DUT 100 that is an electronic component to be tested. As shown in FIG. 1, the electronic component test apparatus 1 includes a tester 2 that tests the DUT 100 and handlers 20 that conveys the DUT 100 and press the DUT 100 against the sockets 10.

Although not particularly limited, the DUT 100 to be tested is, for example, a semiconductor device such as a logic device, a SoC (System on a chip), or a memory device. As illustrated in FIG. 2A and FIG. 2B, the DUT 100 includes a die 110, a board 120, and a lid 130.

The die 110 is a bare die formed by dicing a semiconductor wafer. The die 110 has a temperature detection circuit 111 for detecting the junction temperature in addition to the main circuit to be tested.

The temperature detection circuit 111 is, for example, a circuit including a thermal diode. The temperature detection circuit 111 is not limited to a circuit including a thermal diode, and the temperature detection circuit 111 may be configured using, for example, a circuit including an element having a resistance characteristic and a band gap characteristic depending on temperature. Alternatively, a thermocouple may be used as the temperature detection circuit 111.

The board 120 is a wiring board having an upper surface on which a die 110 is mounted, and the board 120 has terminals 121 on a lower surface thereof. As described later, when the DUT 100 is pressed against the socket 10 by the contact arm 30, the contactor 11 of the socket 10 contacts the terminal 121 (refer to FIG. 7B).

The lid 130 is a lid member fixed to the board 120 so as to cover the die 110, and a space 131 is formed between the die 110 and the lid 130. In the present embodiment, the lid 130 is formed with an inlet 132 and an outlet 133. The space 131 communicates with the outside through the inlet 132 and the outlet 133. The space 131, the inlet 132, and the outlet 133 are used to control the temperature of the DUT 100 by the temperature control device 40 described later. The space 131 corresponds to an example of a "device flow path."

Although the inlet 132 and the outlet 133 have a rectangular shape in the present embodiment, the shape of the inlet 132 and the outlet 133 is not particularly limited to this. For example, the shape of the inlet 132 and outlet 133 may be circular. Although one inlet 132 and one outlet 133 are formed in the present embodiment, the number of the inlet 132 and the outlet 133 is not particularly limited to this. For example, multiple inlets 132 and multiple outlets 133 may be formed in the lid 130.

The tester 2 tests the DUT 100 whose temperature is controlled by a temperature control device 40 which will be described later. The tester 2 includes a main frame (tester body) 3 and a test head 4, as shown in FIG. 1. A mainframe 3 is connected to the test head 4 via cable 5. Sockets 10 are mounted on the upper portion of the test head 4. The test head 4 is provided in a space 21 disposed a lower portion of the handler 20 so that the sockets 10 are positioned inside the handler 20 through the opening 22.

Each of the sockets 10 has contacts 11 (see FIG. 7B) that contact the terminals 121 of the DUT 100. Although not limit to this, examples of the contact 11 include a pogo pin, a cantilever-type probe needle, an anisotropic conductive rubber sheet, and a membrane-type contact in which bumps are formed on an insulating film. The number of sockets 10 mounted on the upper portion of the test head 4 is not particularly limited, and multiple sockets 10 may be mounted on the upper portion of the test head 4.

The handler 20 is configured to transport the DUT 100 before testing to the socket 10, press the DUT 100 against the socket 10, and classify the DUT 100 according to the test results. As shown in FIG. 1, the handler 20 includes a contact arm 30 and a temperature control device 40 (see FIG. 3).

The contact arm 30 is a transfer arm that holds and moves the DUT 100 to press the DUT 100 against the socket 10. When the DUT 100 is pressed against the socket 10 by the contact arm 30, the DUT 100 and the socket 10 are electrically connected.

The contact arm 30 has an arm body 31 and a contact chuck 32. The arm body 31 is movable and rotatable on the XY plane and vertically movable along the Z direction by an actuator that is not shown. The contact chuck 32 is attached to the distal portion of the arm body 31. The contact chuck 32 corresponds to an example of the "pusher."

Figure 3:
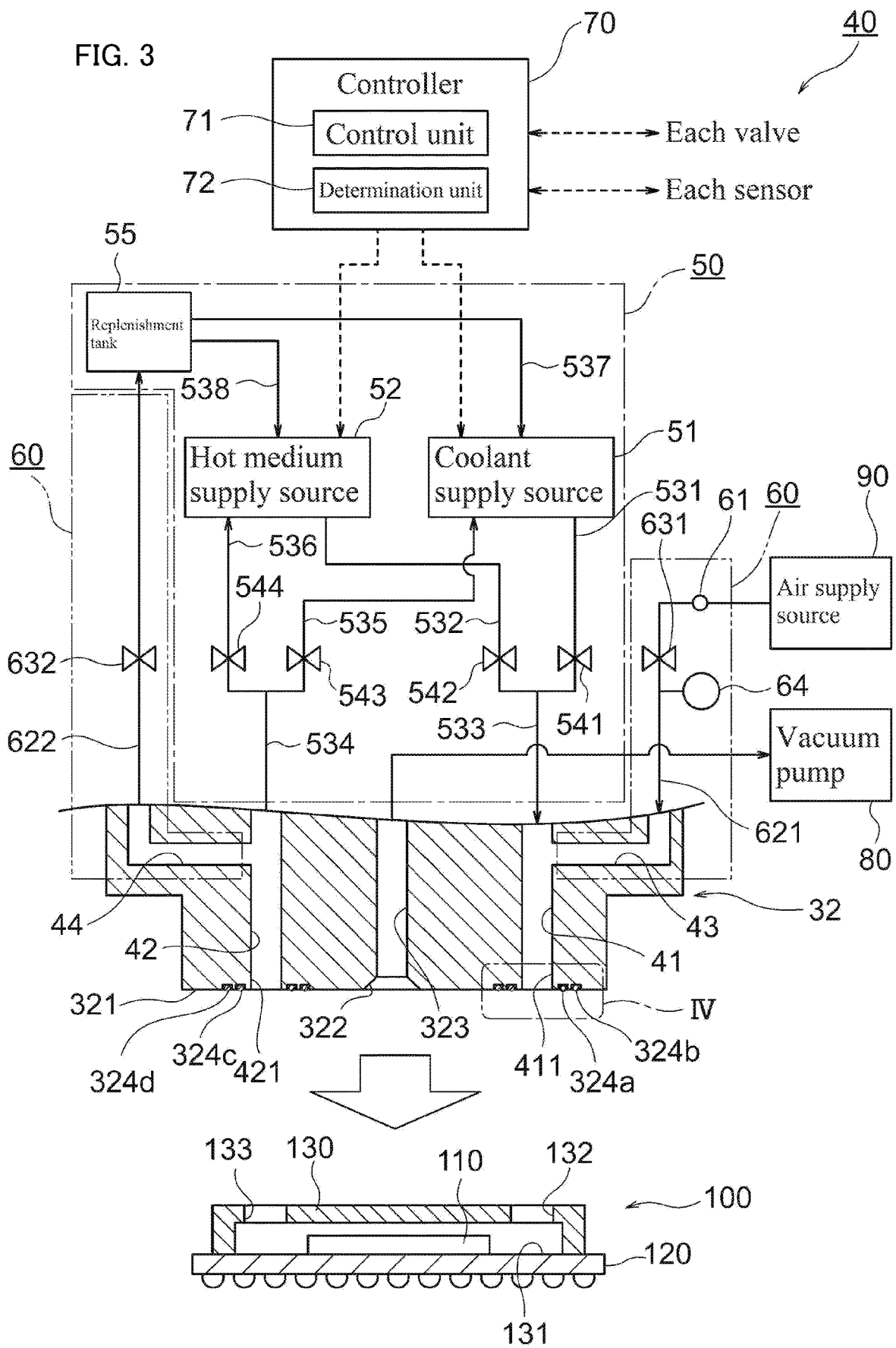
FIG. 3 is a diagram showing a cross section of the contact chuck corresponding to the III section of FIG. 1 and the system configuration of the temperature control device in the first embodiment of the present invention.
Figure 4A:
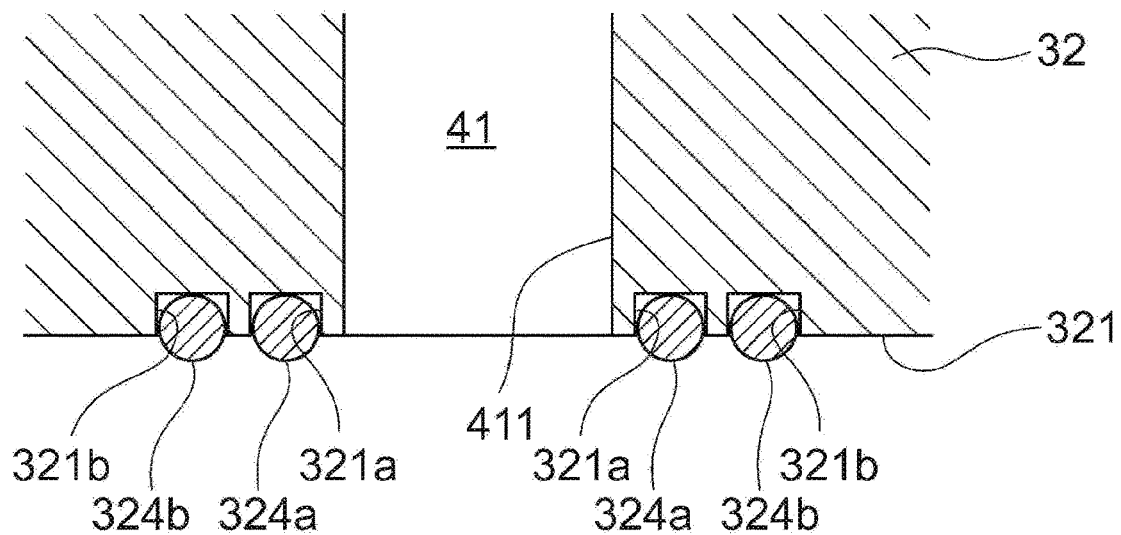
FIG. 4A and FIG. 4B are a cross-sectional view and a bottom view showing the distal portion of the contact chuck in the first embodiment of the present invention and is a diagram corresponding to the IV section in FIG. 3.
Figure 4B:
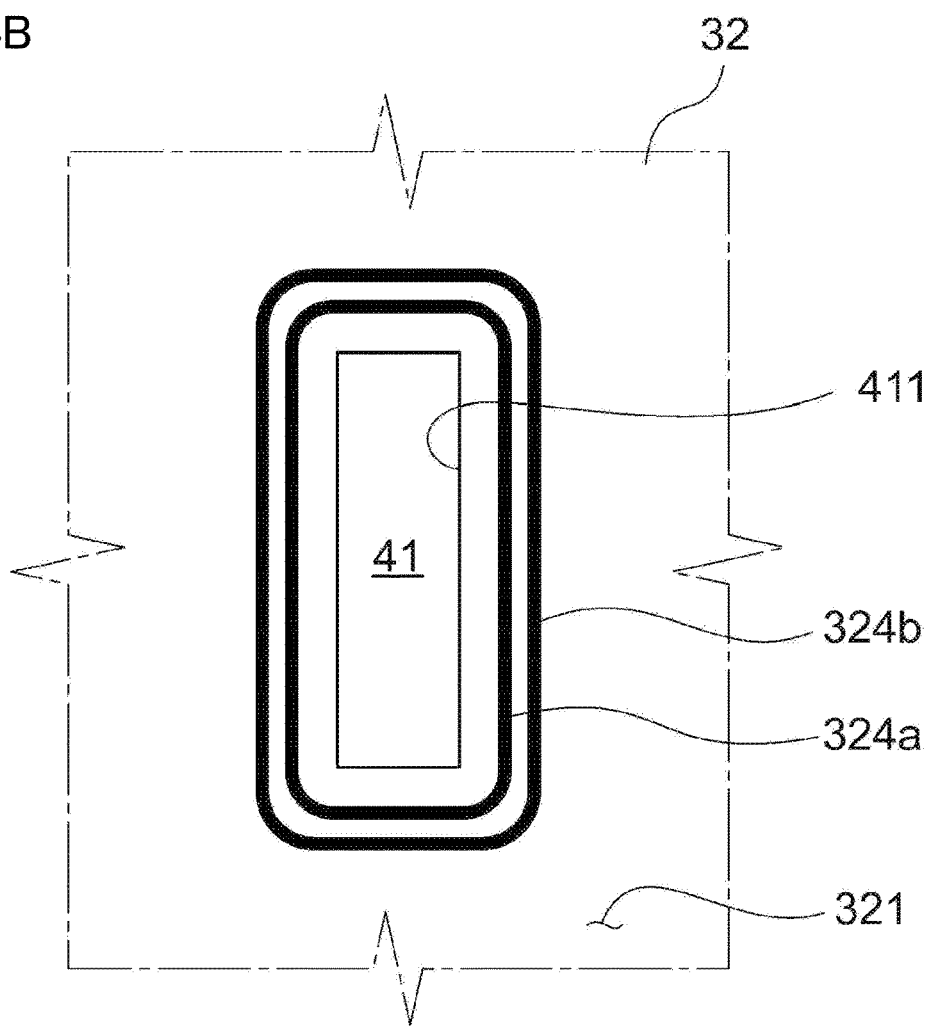

FIG. 3 is a diagram showing a cross section of the contact chuck corresponding to the III section of FIG. 1 and the system configuration of the temperature control device in the first embodiment of the present invention. FIG. 4A and FIG. 4B are a cross-sectional view and a bottom view showing the distal portion of the contact chuck in the first embodiment of the present invention and is a diagram corresponding to the IV section in FIG. 3.

As shown in FIG. 3, the contact chuck 32 has a suction pad 322 that opens to the distal end surface 321 of the contact chuck 32. The suction pad 322 communicates with the vacuum pump 80 via a flow hole 323 formed in the contact chuck 32. The contact arm 30 can hold the DUT 100 by sucking the upper surface of the DUT 100 with the suction pad 322.

The temperature control device 40 is a device that controls the temperature of the DUT 100 to allow high temperature testing or low temperature testing of the DUT 100 and to offset the self-heating of the DUT 100. The temperature control device 40 controls the temperature of the DUT 100 using a coolant and a hot medium in a state where the distal portion of the contact arm 30 (contact chuck 32) is in contact with the DUT 100. In the present embodiment, the temperature control device 40 supplies the coolant and the hot medium to the space 131 inside the DUT 100 via the inlet 132 of the DUT 100 and causes the coolant and the hot medium to be in direct contact with the die 110 to efficiently perform the temperature control of the DUT 100.

As shown in FIG. 3, the temperature control device 40 of the present embodiment includes flow holes 41 to 44, a fluid supply system 50, a purge system 60, and a controller 70. The flow hole 41 corresponds to an example of the "first flow path," and the flow hole 42 corresponds to an example of the "second flow path."

The flow holes 41 to 44 are formed in the contact chuck 32 of the contact arm 30. The flow holes 41 and 42 have connection ports 411 and 421 that opens to the distal end surface 321 of the contact chuck 32 at one ends of the flow holes 41 and 42. The other ends of the flow holes 41 and 42 are connected to the fluid supply system 50. In contrast, the flow holes 43 and 44 are respectively branched from the flow holes 41 and 42 and are both connected to the purge system 60.

The connection ports 411 and 421 have rectangular shapes corresponding to the shapes of the inlet 132 and the outlet 133 of the DUT 100 described above (see FIG. 4B). The connection ports 411 and 421 are respectively arranged on the distal end surface 321 of the contact chuck 32 so as to correspond to the inlet 132 and the outlet 13. When the distal end surface 321 of the contact chuck 32 contacts the upper surface of the lid 130 of the DUT 100, one connection port 411 faces the inlet 132 and communicates with the inlet 132, and the other connection port 421 communicates with the outlet 133 and communicates with the outlet 133.

The contact chuck 32 is detachably attached to the arm body 31. For example, when the type of the DUT 100 is changed, the contact chuck 32 is replaced with a contact chuck 32 suitable for the changed DUT 100. The replaced contact chuck 32 has connection ports 411 and 421 corresponding to the inlet 132 and outlet 133 of the changed DUT 100.

Figure 5:
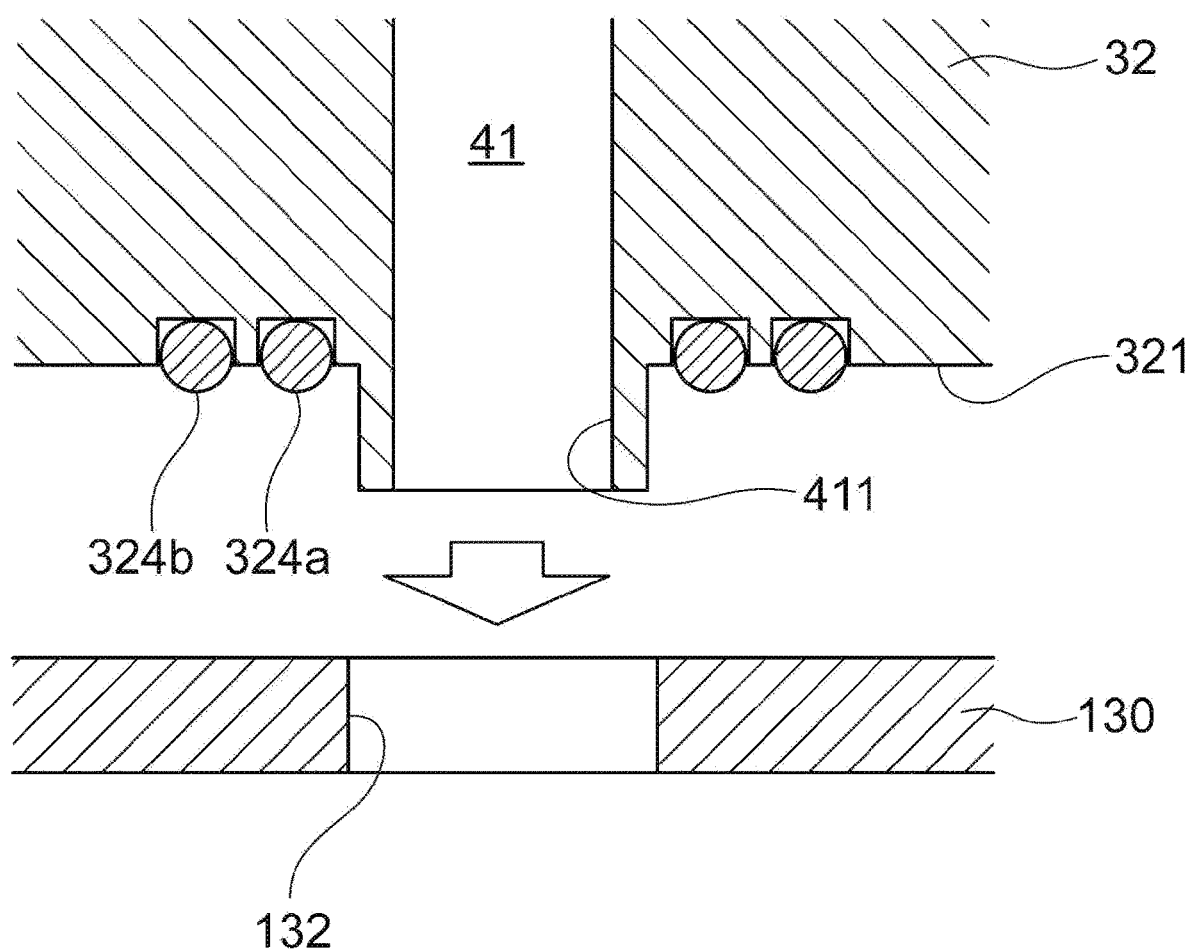
FIG. 5 is a cross-sectional view showing a modification of the distal portion of the contact chuck in the first embodiment of the present invention.

As shown in FIG. 5, the connection ports 411 and 421 may protrude downward from the distal end surface 321 of the contact chuck 32 in a tubular shape. In this case, when the distal end surface 321 of the contact chuck 32 contacts the lid 130 of the DUT 100, the connection ports 411 and 421 are respectively inserted into the inlet 132 and outlet 133 of the lid 130. FIG. 5 is a cross-sectional view showing a modification of the distal portion of the contact chuck in the present embodiment.

Returning to FIG. 4A and FIG. 4B, in the present embodiment, two annular grooves 321a and 321b are formed in the distal end surface 321 of the contact chuck 32 so as to surround the connection port 411. One groove 321a is arranged adjacent to the connection port 411, and the other groove 321b is arranged outside the one groove 321a. Seal rings 324a and 324b are respectively press-fitted into the two grooves 321a and 321b. The seal rings 324a and 324b correspond to an example of the "first seal ring."

Similarly, as for the connection port 421, two annular grooves are formed in the distal end surface 321 of the contact chuck 32 so as to surround the connection port 421. One groove is arranged adjacent to the connection port 421, and the other groove is arranged outside the one groove. Seal rings 324c and 324d are respectively press-fitted into these two grooves. The seal rings 324c and 324d correspond to an example of the "second seal ring."

That is, in the present embodiment, the sealing rings 324a and 324b are arranged in double around the connection port 411 to improve the sealing property between the connection port 411 and the inlet 132. Similarly, the seal rings 324c and 324d are arranged in double around the connection port 421 to improve the sealing property between the connection port 421 and the outlet 133. As such seal rings 324a to 324d, for example, an annular member made of an elastically deformable resin material such as rubber can be exemplified.

The number of seal rings arranged around the connection ports 411 and 421 is not particularly limited to the above, and one or more sealing rings may be arranged around each connection port 411 and 421. When three or more seal rings are arranged around each connection port 411 and 421, the seal rings are arranged in multiplex around each connection port 411 and 421.

The fluid supply system 50 is a system that supplies and collects a coolant and a hot medium to the DUT 100 via the flow holes 41 and 42. As long as the fluid supply system 50 supplies the DUT 100 with the fluid for temperature control (temperature control fluid) via the flow holes 41 and 42, the configuration of the fluid supply system 50 is not particularly limited to the configuration described below.

As shown in FIG. 3, the fluid supply system 50 includes a coolant supply source 51, a hot medium supply source 52, pipes 531 to 538, and valves 541 to 544.

The coolant supply source 51 includes, for example, a chiller and a pump, and the coolant supply source 51 adjusts the temperature of the coolant to a first temperature and supplies the coolant to the pipe 531. The valve 541 is installed on the pipe 531, and the valve 541 can adjust the flow rate of the coolant. The coolant corresponds to an example of the "first fluid" and "third fluid," and the coolant supply source 51 corresponds to an example of the "second supply source."

On the other hand, the hot medium supply source 52 includes, for example, a boiler and a pump, and the hot medium supply source 52 adjusts the temperature of the hot medium to a second temperature higher than the first temperature and supplies the hot medium to the pipe 532. The valve 542 is installed on the pipe 532, and the valve 542 can adjust the flow rate of the hot medium. The hot medium corresponds to an example of the "first fluid" and "fourth fluid," and the hot medium supply source 52 corresponds to an example of the "third supply source."

The pipes 531 and 532 merge with each other and are connected to the pipe 533. Further, the pipe 533 is connected to the flow hole 41 of the contact chuck 32 described above. The pipes 531 to 533 correspond to an example of the "third flow path," and the valves 541 and 542 correspond to an example of the "first valve."

The pipe 534 is connected to the flow 42 of the contact chuck 32 described above. The pipe 534 branches into pipes 535 and 536. While one pipe 535 is connected to the coolant supply source 51, the other pipe 536 is connected to the hot medium supply source 52.

The valve 543 is installed on one of the pipes 535, and the valve 543 can adjust the flow rate of the fluid directed to the coolant supply source 51. Similarly, the valve 544 is installed on the other pipe 536, and the valve 544 can adjust the flow rate of the fluid directed to the hot medium supply source 52. The pipes 534 to 536 correspond to an example of the "fourth flow path," and the valves 543 and 544 correspond to an example of the "second valve."

Although not particularly limited, as specific examples of the coolant and the hot medium, for example, brine that is a fluorine-based inert solution can be exemplified.

Further, the fluid supply system 50 of the present embodiment includes a replenishment tank 55 in which liquids used as coolant and hot medium are stored. The replenishment tank 55 is respectively connected to the coolant supply source 51 and the hot medium supply source 52 through pipes 537 and 538.

For example, when the amount of coolant in the coolant supply source 51 becomes equal to or less than a specified value, the coolant supply source 51 is replenished with liquid from the replenishment tank 55 through the pipe 537. Similarly, when the amount of hot medium in the hot medium supply source 52 becomes equal to or less than a specified value, the hot medium supply source 52 is replenished with liquid from the replenishment tank 55 through the pipe 538.

In the example shown in FIG. 3, the fluid supply system 50 supplies the temperature control liquid to the contact chuck 32 from the arm body 31 side of the contact arm 30, however the configuration of the fluid supply system 50 is not particularly limited to this. For example, the fluid supply system 50 may supply the liquid to the contact chuck 32 from the test head 4 side via a socket guide (not shown) disposed around the socket 10.

Similarly, in the example shown in FIG. 3, the fluid supply system 50 collects the liquid from the contact chuck 32 to the arm body 31 side, however the configuration of the fluid supply system 50 is not particularly limited to this. For example, the fluid supply system 50 may collect the liquid from the contact chuck 32 to the test head 4 side via a socket guide (not shown).

The purge system 60 is a system that supplies the purge air to the space 131 inside the DUT 100 through the flow holes 41 and 42 and discharges the liquid remaining in the space 131 to the outside of the DUT 100. The purge system 60 includes a connecting part 61, pipes 621 and 622, valves 631 and 632 and a pressure sensor 64.

The connecting part 61 is connected to an air supply source 90 that supplies air for purging (purge air). The air supply source 90 includes, for example, a pump that supplies outside air to the connecting part 61. As the air supply source 90, an existing factory pipe or the like may be used. The air supply source 90 corresponds to an example of the "first supply source."

The connecting part 61 is provided at one end of the pipe 621. The other end of the pipe 621 is connected to the flow hole 43 of the contact chuck 32. The valve 631 is installed on the pipe 621, and it is possible to supply or stop the purge air from the air supply source 90 to the flow hole 41 and to adjust the flow rate of the purge air by opening and closing the valve 631. The pipe 621 and the flow hole 43 correspond to an example of the "fifth flow path," and the valve 631 corresponds to an example of the "third valve."

The pressure sensor 64 is connected to the pipe 621. The pressure sensor 64 can detect the pressure inside the flow hole 41 via the pipe 621 and the flow hole 43. The pressure sensor 64 is connected to the controller 70 so as to be able to output the detection result to a determination unit 72 (described later).

On the other hand, the pipe 622 connects the flow hole 44 of the contact chuck 32 and the replenishment tank 55. The valve 632 is installed on the pipe 622, and it is possible to connect and block between the flow hole 44 and the replenishment tank 55 by opening and closing the valve 632. The pipe 622 and the flow hole 44 correspond to an example of the "sixth flow path," and the valve 632 corresponds to an example of the "fourth valve."

In the example shown in FIG. 3, the purge system 60 supplies the purge air to the contact chuck 32 from the arm body 31 side of the contact arm 30, however the configuration of the purge system 60 is not particularly limited to this. For example, the purge system 60 may supply the purge air to the contact chuck 32 from the test head 4 side via a socket guide (not shown) disposed around the socket 10.

Similarly, in the example shown in FIG. 3, the purge system 60 collects the purge air from the contact chuck 32 to the arm body 31 side, however the configuration of the purge system 60 is not particularly limited to this. For example, the purge system 60 may collect the purge air from the contact chuck 32 to the test head 4 side via a socket guide (not shown).

The controller 70 includes a control unit 71 and a determination unit 72. The control unit 71 has a function of controlling the fluid supply system 50 and the purge system 60, and, for example, the controller 70 controls opening and closing of the valves 541 to 544, 631, 632.

Specifically, when the temperature of the DUT 100 is controlled, the control unit 71 controls the valves 541 to 544 to adjust the flow rate of fluid supplied to the space 131 of the DUT 100 based on the output signal from the temperature detection circuit 111 of the DUT 100. The output signal from the temperature detection circuit 111 is obtained via the socket 10. Further, the control unit 71 controls the valves 631 and 632 to perform the purge process in the space 131 of the DUT 100 or to support the separation of the contact chuck 32 from the DUT 100 with which the contact chuck 32 is in close contact.

The determination unit 72 determines the sealing state between the connection port 411 of the contact chuck 32 and the inlet 132 of the lid 130 of the DUT 100 and the sealing state between the connection port 421 of the contact chuck 32 and the outlet 133 of the lid 130 of the DUT 100 based on the detection result of the pressure sensor 64.

The controller 70 is configured by, for example, a computer having a processor, and functionally includes a control section 71 and a determination section 72. The functions 71 and 72 are realized by the processor executing software installed in the computer constituting the controller 70. The controller 70 may be constituted by a circuit board instead of a computer.

Hereinafter, referring to FIG. 6 and FIG. 7A to FIG. 7G, the temperature control method of the temperature of the DUT 100 using the temperature control device 40 described above will be described.

Figure 6:
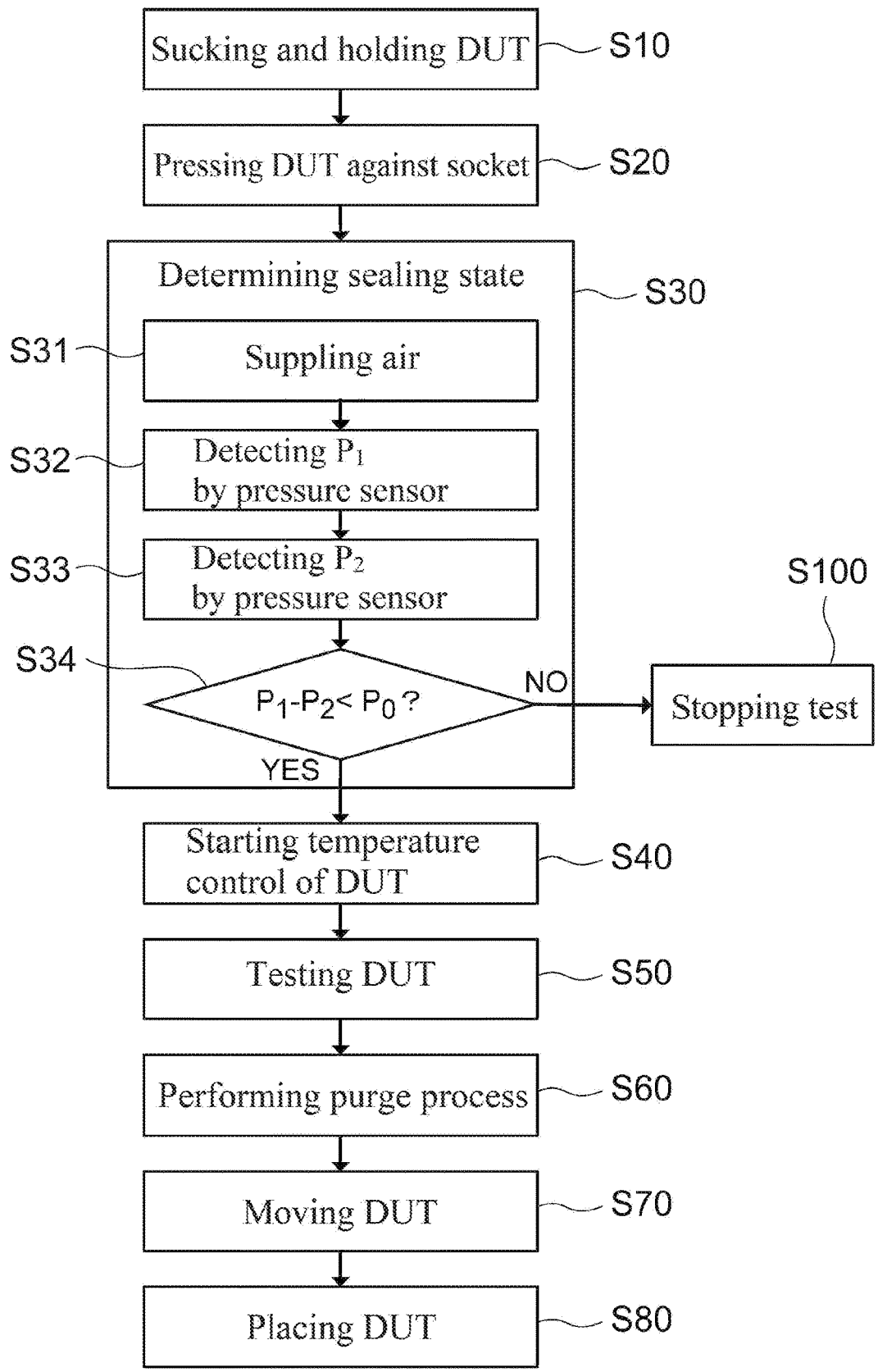
FIG. 6 is a flow chart showing the temperature control method in the first embodiment of the present invention.

FIG. 6 is a flow chart showing the temperature control method in the first embodiment of the present, and FIG. 7A to FIG. 7G are a diagram showing the operation of the temperature control device in the first embodiment of the present invention.

First, in the step S10 of FIG. 6, after the contact arm 30 moves above the holder 200 on which the DUT 100 is placed, the contact chuck 32 is lowered to bring the distal end surface 321 of the contact chuck 32 into contact with the upper surface of the lid 130 of the DUT 100, as shown in 7A. Next, the DUT 100 is sucked and held by the suction pad 322 by being sucked by the vacuum pump 80 via the flow hole 323. Although not particularly limited, as a specific example of the holder 200, a customer tray, a heat plate, a buffer plate, or the like can be exemplified.

In this state, the connection port 411 of the contact chuck 32 is connected to the inlet 132 of the DUT 100, and the flow hole 41 of the contact chuck 32 and the space 131 of the DUT 100 are communicated with each other. Similarly, the connection port 421 of the contact chuck 32 is connected to the outlet 133 of the DUT 100, and the flow hole 42 of the contact chuck 32 and the space 131 of the DUT 100 communicate with each other. In this state, all valves 541 to 544, 631 and 632 are close.

Figure 7A:
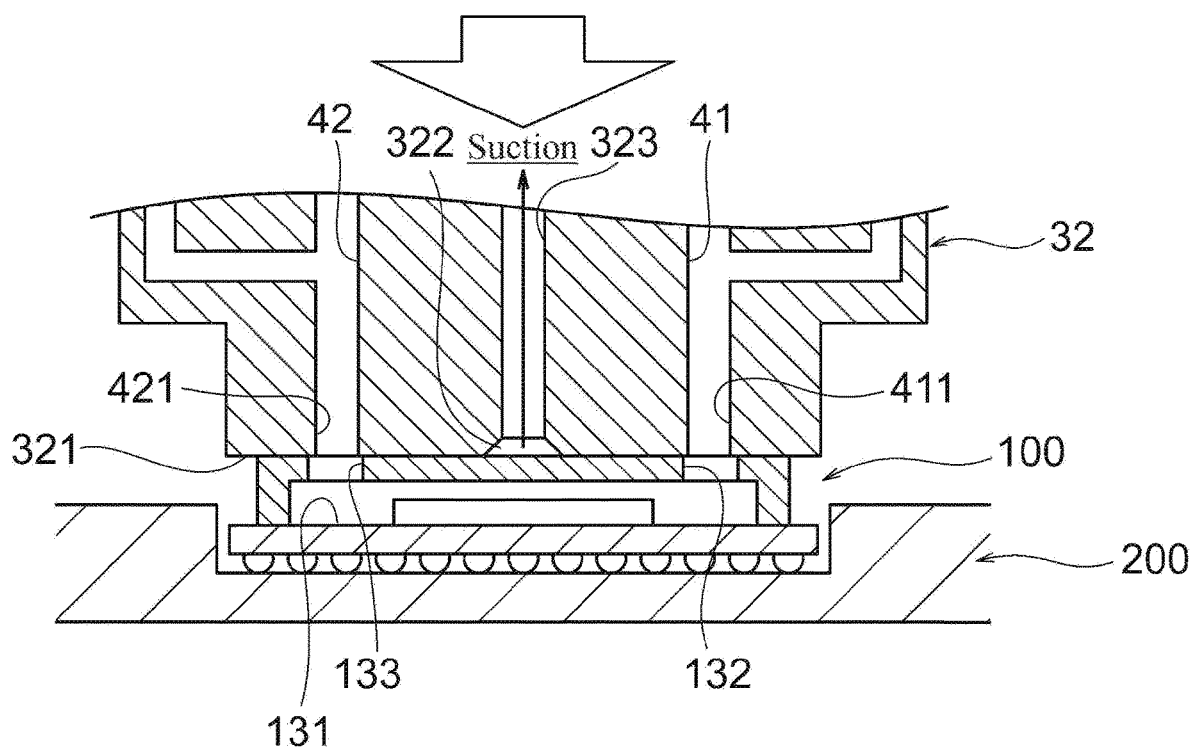
FIG. 7A is a diagram showing the operation of the temperature control device in the first embodiment of the present invention and is a diagram corresponding to step S10 in FIG. 6.
Figure 7B:
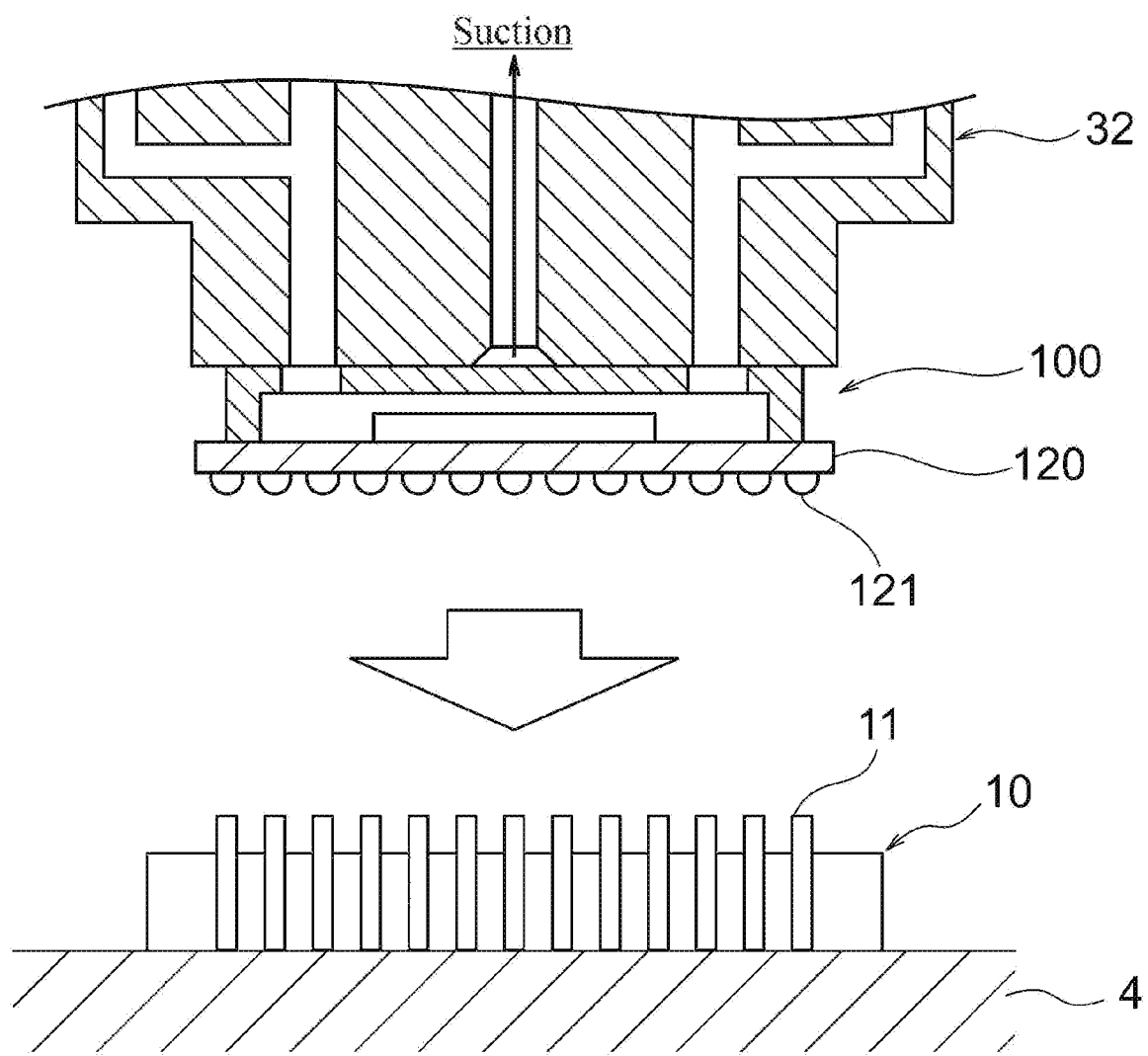
FIG. 7B is a diagram showing the operation of the temperature control device in the first embodiment of the present invention and is a diagram corresponding to step S20 in FIG. 6.
Figure 7C:
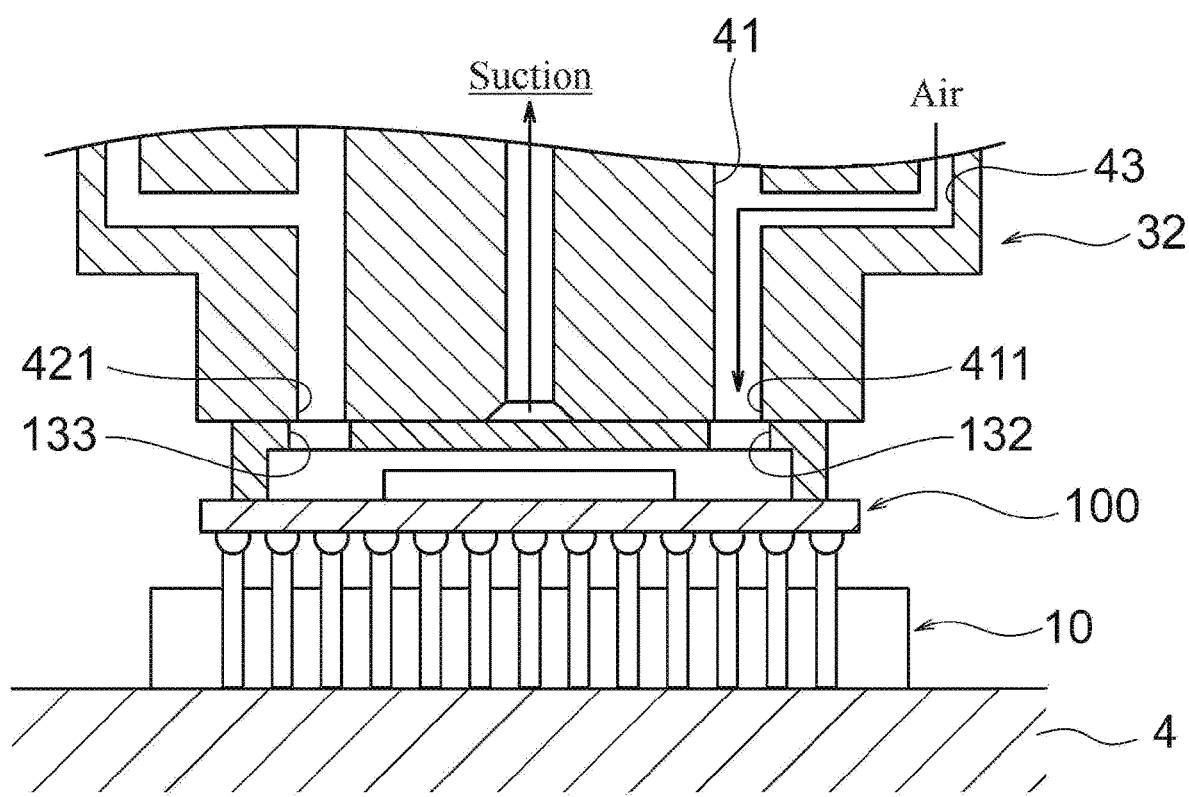
FIG. 7C is a diagram showing the operation of the temperature control device in the first embodiment of the present invention and is a diagram corresponding to step S30 in FIG. 6.

Next, in the step S20 of FIG. 6, after the contact arm 30 moves the DUT 100 above the socket 10 as shown in FIG. 7B, the contact chuck 32 is lowered to press the DUT 100 against the socket 10. As a result, the terminals 121 of the DUT 100 contact the contacts 11 of the socket 10, and the DUT 100 and the socket 10 are electrically connected.

Next, in the step S30 of FIG. 6, the determination unit 72 of the controller 70 determines the sealing state between the connection port 411 of the contact chuck 32 and the inlet 132 of the DUT 100 and the sealing state between the connection port 421 of the contact chuck 32 and the outlet 133 of the DUT 100. The step S30 may be executed after the step S10 and before the step S20.

Specifically, in step S31 of FIG. 6, the valve 631 is opened while the valves 521 to 524 and 632 remain close under the control of the control unit 71. As a result, as shown in the FIG. 7C, the purge air is supplied from the air supply source 90 to the space 131 of the DUT 100 via the pipe 621 and the flow holes 43 and 41.

Next, in step S32 of FIG. 6, the pressure sensor 64 detects pressure after the valve 631 is closed. At this time, since all the valves 541 to 544, 631 and 632 are close, the decrease in the pressure of the purge air is caused by the leakage of the purge air. Since the pipe 621 is connected to the flow hole 41 via the flow hole 43, the pressure sensor 64 detects the pressure inside the flow hole 41. Then, the pressure sensor 64 outputs the detection result to the determination unit 72 of the controller 70 as the first pressure value $P_1$.

Then, after a predetermined time has elapsed from step S32, the pressure sensor 64 detects the pressure again in step S33 of FIG. 6. The pressure sensor 64 outputs the detected pressure inside the flow hole 41 to the determination unit 72 of the controller 70 as the second pressure value $P_2$. Although not particularly limited, a specific example of the predetermined time is, for example, one second.

Next, in step S34 of FIG. 6, the determination unit 72 of the controller 70 compares the first pressure value $P_1$ and the second pressure value $P_2$ and determines whether the difference $\Delta P$ is less than the predetermined value $P_0$ ($P_1 - P_2 = \Delta P < P_0$).

Then, when the difference $\Delta P$ is less than the predetermined value $P_0$ ($\Delta P < P_0$), the determination unit 72 determines that the sealing property (airtightness) between the connecting port 411 of the contact chuck 32 and the inlet 132 of the DUT 100 and the sealing property between the connecting port 421 of the contact chuck 32 and the outlet 133 of the DUT 100 are secured. In this case, since the fluid does not leak from between the connection port 411 and the inlet 132 or between the connection port 421 and the outlet 133 when the temperature control fluid is supplied to the space 131 of the DUT 100 in step S40 of FIG. 6, the process proceeds to step S40 (YES in step S34).

On the other hand, when the difference $\Delta P$ is not less than the predetermined value $P_0$ ($\Delta P \geq P_0$), the determination unit 72 determines that the sealing property between the connecting port 411 of the contact chuck 32 and the inlet 132 of the DUT 100 and the sealing property between the connecting port 421 of the contact chuck 32 and the outlet 133 of the DUT 100 are not secured. In this case, since the liquid may leak from between the connection port 411 and the inlet 132 or between the connection port 421 and the outlet 133 when the temperature control fluid is supplied to the space 131 of the DUT 100 in step S40 of FIG. 6, the test of DUT 100 is stopped in step S100 of FIG. 6 (NO in step S34).

In the present embodiment, it is possible to confirm the sealing state between the DUT 100 and the contact chuck 32 by using the purge system 60 prior to supplying the temperature control liquid.

Then, when it is confirmed in step S34 that the sealing property is ensured (YES in step S34), the temperature control of the DUT 100 is started in step S40 of FIG. 6.

Specifically, first, the control unit 71 of the controller 70 acquires the output signal of the temperature detection circuit 111 of the DUT 100 via the socket 10. Next, the controller 71 calculates the junction temperature Tj of the die 110 based on the output signal. The controller 71 then controls the valves 541 to 544 so that the difference between the calculated result of the junction temperature Tj and the target temperature of the DUT 100 is smaller.

As specific examples of the control using the junction temperature, the control described in U.S. patent application Ser. No. 15/719,849 (U.S. Patent Application Publication No. 2019/0101587 A1), U.S. patent application Ser. No. 16/351,363 (U.S. Patent Application Publication No. 2020/0033402 A1), U.S. patent application Ser. No. 16/575,460 (U.S. Patent Application Publication No. 2020/0241582 A1), and U.S. patent application Ser. No. 16/575,470 (U.S. Patent Application Publication No. 2020/0241040 A1) can be exemplified.

Figure 7D:
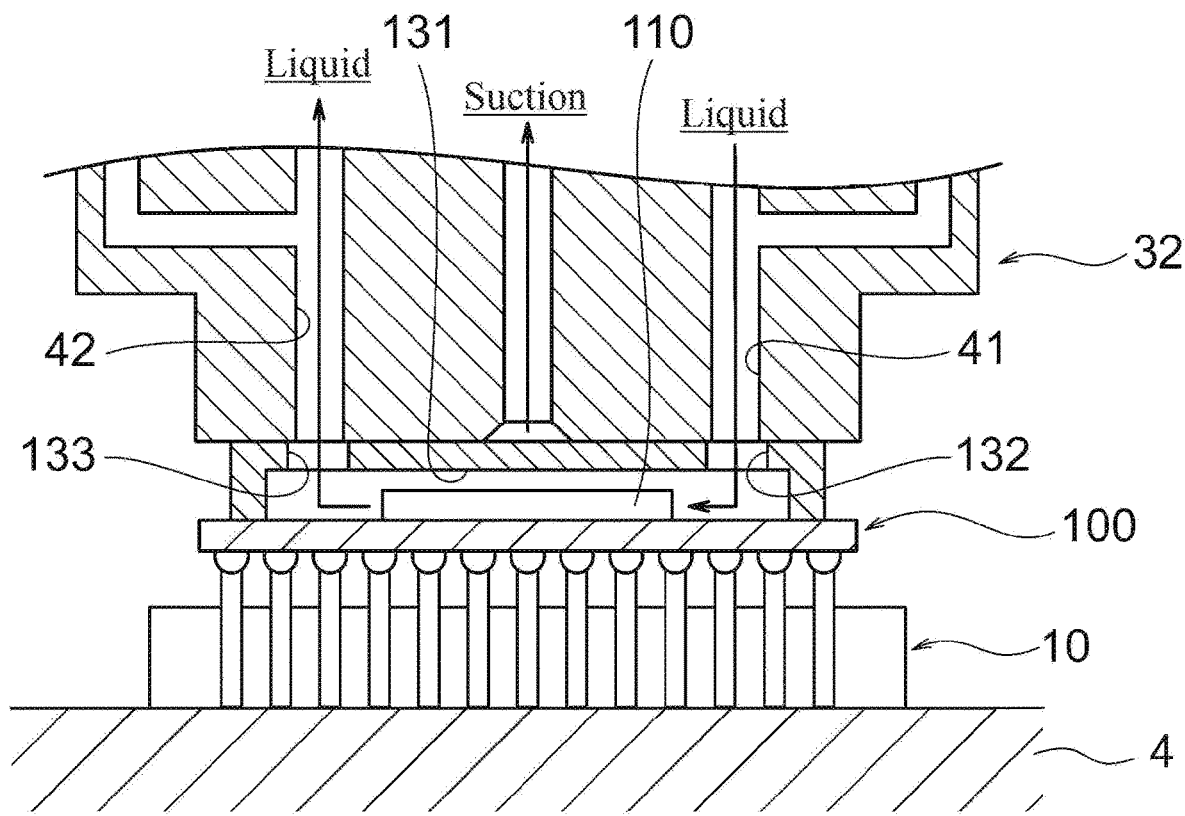
FIG. 7D is a diagram showing the operation of the temperature control device in the first embodiment of the present invention and is a diagram corresponding to step S40 in FIG. 6.

For example, when the temperature of the DUT 100 is to be lowered, the coolant is supplied from the coolant supply source 51 to the space 131 of the DUT 100 via the pipes 531 and 533 and the flow hole 41 by opening the valves 541 and 543 and closing the valves 542 and 544 as shown in FIG. 7D. The coolant that has entered the space 131 of the DUT 100 cools the die 110 by directly contacting the die 110 and exchanging heat while passing through the space 131 from the inlet 132 to the outlet 133. The coolant that has passed through the outlet 133 is returned to the coolant supply source 51 via the flow holes 42 and the pipes 534 and 535. In this state, the valves 631 and 632 are close.

On the other hand, when the temperature of the DUT 100 is to be raised, the hot medium is supplied from the hot medium supply source 52 to the space 131 of the DUT 100 via the pipes 532 and 533 and the flow hole 41 by opening the valves 542 and 544 and closing the valves 541 and 543 as shown FIG. 7D. The hot medium that has entered the space 131 of the DUT 100 heats the die by directly contacting the die 110 and exchanging heat while passing through the space 131 from the inlet 132 to the outlet 133. The hot medium that has passed through the outlet 133 is returned to the hot medium supply source 52 via the flow hole 42 and the pipes 534 and 536. In this state, the valves 631 and 632 are close.

The liquid mixture of the coolant and the hot medium may be supplied to the space 131 of the DUT 100 by adjusting the flow rate of the coolant with the valve 541 and adjusting the flow rate of the hot medium with the valve 542.

When the temperature of the DUT 100 reaches the target temperature, the tester 2 tests the electrical characteristics of the DUT 100 in step S50 of FIG. 6. Specifically, the tester 2 inputs a test signal based on a test pattern for testing the DUT 100 to the DUT 100 and determines the quality of the DUT 100 based on an output signal output from the DUT 100 in response to the test signal. Since the DUT 100 self-generates heat in accordance with the test, the temperature of the DUT 100 is adjusted by the temperature control device 40 during the test.

When the test of the DUT 100 is completed, after the valves 541 to 544 are closed under the control of the control unit 71, in step S60 of FIG. 6, a purge process is performed to discharge the liquid supplied from the fluid supply system 50 from the space 131 of the DUT 100. The step S60 may be executed after step S70 and before step S80.

Figure 7E:
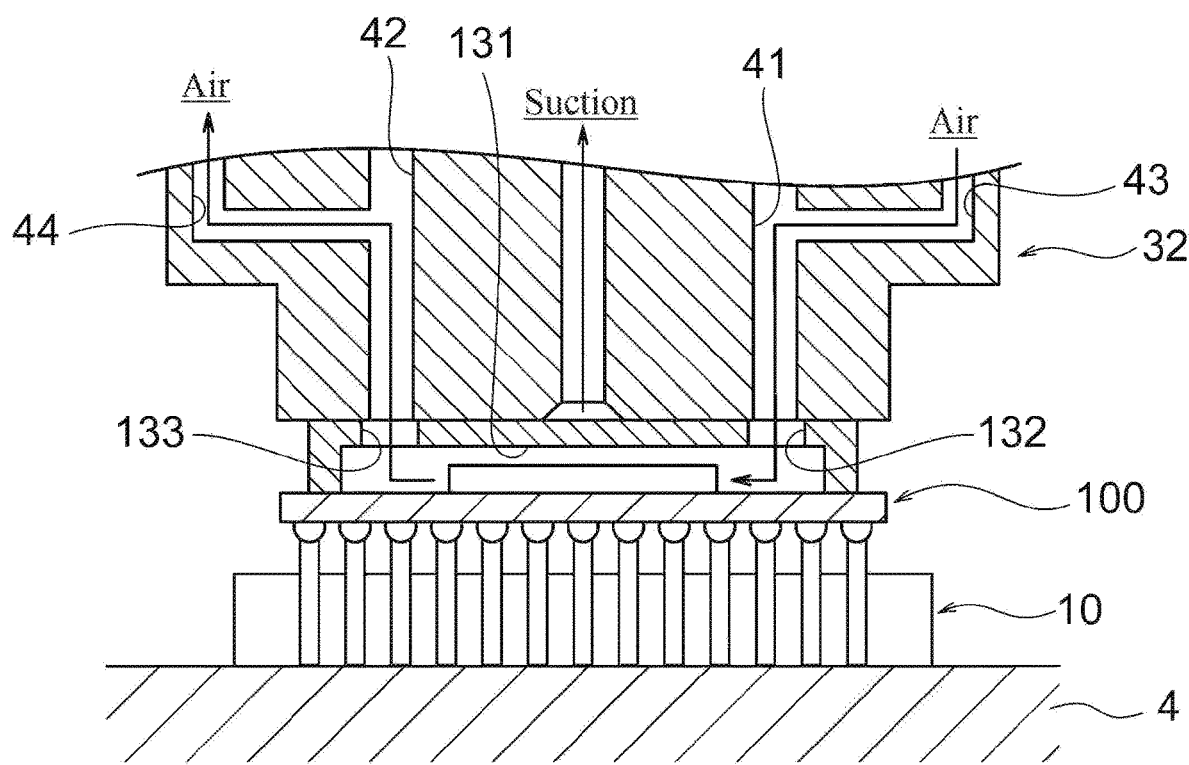
FIG. 7E is a diagram showing the operation of the temperature control device in the first embodiment of the present invention and is a diagram corresponding to step S60 in FIG. 6.

Specifically, the valves 631 and 632 are opened and the valves 541 to 544 are closed under the control of the controller 71. As a result, as shown in FIG. 7E, the purge air is supplied from the air supply source 90 to the space 131 of the DUT 100 via the pipe 621 and the flow holes 43 and 41. The purge air then pushes out the liquid remaining in the space 131 via the outlet 133. This liquid is collected in the replenishing tank 55 via the flow holes 42 and 44 and the pipe 622 and is reused as the liquid for temperature control.

In the present embodiment, since the temperature control liquid is discharged from the DUT 100 by supplying the purge air from the purge system 60 after the temperature is controlled by the fluid supply system 50, it is possible to suppress the occurrence of the liquid remaining in the DUT 100.

In the present embodiment, since the temperature control liquid discharged from the DUT 100 is returned to the fluid supply system 50 by the purge air, it is possible to reduce the amount of liquid used for temperature control.

Figure 7F:
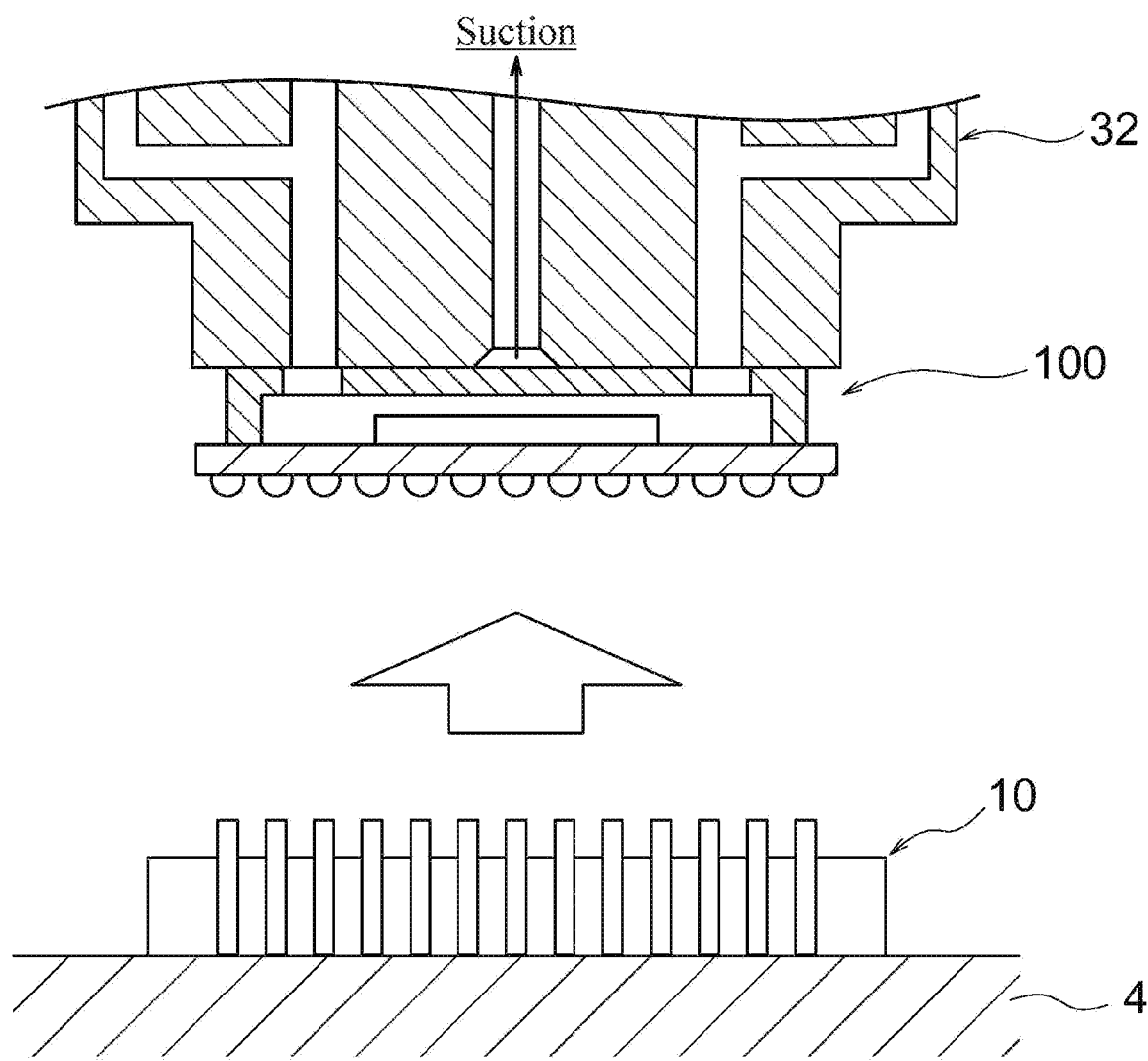
FIG. 7F is a diagram showing the operation of the temperature control device in the first embodiment of the present invention and is a diagram corresponding to step S70 in FIG. 6.

Next, in step S70 of FIG. 6, as shown in FIG. 7F, the contact arm 30 raises the DUT 100 to move the DUT 100 away from the socket 10.

Then, in step S80 of FIG. 6, the contact arm 30 lowers the DUT to place the DUT 100 on the holder 200 (see FIG. 7G) after the contact arm 30 moves the DUT 100 above the holder 200. The holder 200 may be the same as the holder 200 referred to in step S10 above or may be different from the holder 200 in step S10.

Figure 7G:
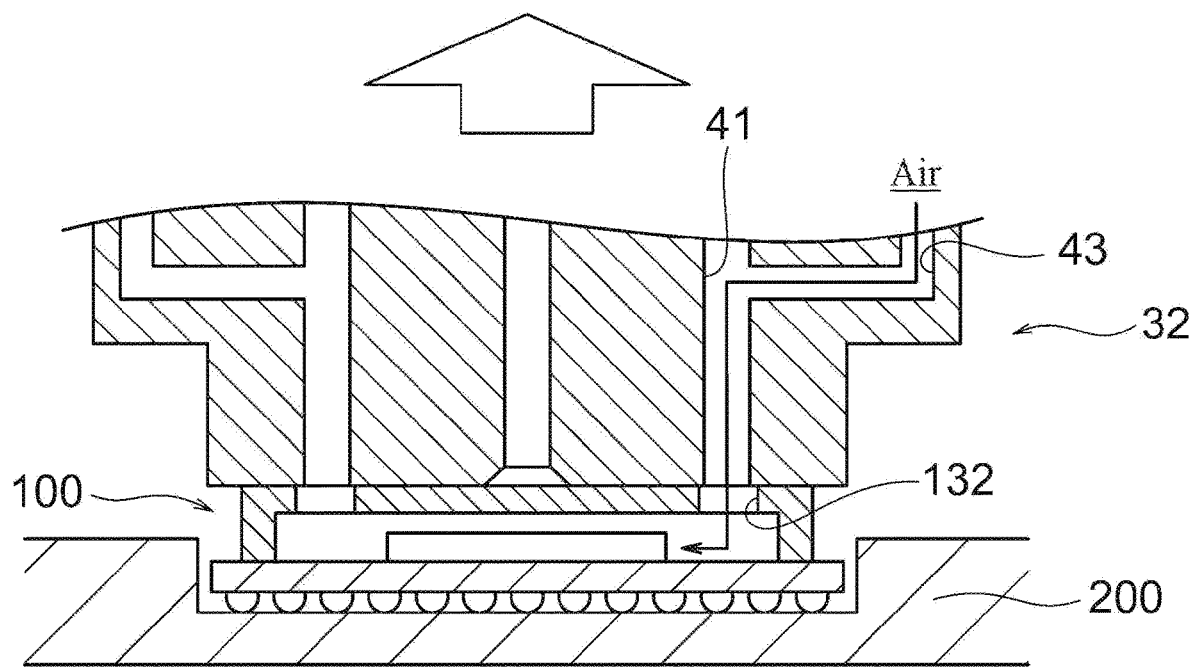
FIG. 7G is a diagram showing the operation of the temperature control device in the first embodiment of the present invention and is a diagram corresponding to step S80 in FIG. 6.

Then, as shown in FIG. 7G, the contact chuck 32 stops sucking and holding the DUT 100, and the contact arm 30 rises to separate the contact chuck 32 from the DUT 100. At this time, since the DUT 100 and the contact chuck 32 may be in close contact with each other, the purge system 60 is used to support the separation of the contact chuck 32 from the DUT 100 in this embodiment.

Specifically, the valve 631 is opened and the valve 632 is closed under the control of the controller 71. As a result, as shown in FIG. 7G, the purge air is supplied from the air supply source 90 to the space 131 of the DUT 100 via the pipe 621 and the flow holes 43 and 41. At this time, since the valves 541 to 544 and 632 are close, the contact chuck 32 is easily separated from the DUT 100 by the pressure of the purge air. In this state, the valves 541-544 are close.

In the present embodiment, since the fluid supply system 50 supplies the temperature control fluid to the space 131 of the DUT 100 via the flow hole 41 to bring the fluid into direct contact with the die 110, it is possible to improve the cooling efficiency of the DUT 100.

It should be noted that the embodiment described above are described to facilitate understanding of the present disclosure and are not described to limit the present disclosure. It is therefore intended that the elements disclosed in the above embodiment include all design modifications and equivalents to fall within the technical scope of the present disclosure.

For example, the fluid supplied to the space 131 of the DUT 100 by the fluid supply system 50 may be only the coolant for cooling the DUT 100. That is, the fluid supply system 50 may include only the coolant supply source as the liquid supply source. Alternatively, the fluid supplied to the space 131 of the DUT 100 by the fluid supply system 50 may be only the hot medium for heating the DUT 100. That is, the fluid supply system 50 may include only the hot medium supply source as the liquid supply source.

In the above-described embodiment, the fluid supplied to the space 131 of the DUT 100 by the fluid supply system 50 is liquid, however the fluid for temperature control may be gas. As the gas for controlling the temperature of the DUT 100, for example, nitrogen or air can be exemplified. Since it is not necessary to collect the fluid when gas is used as the temperature control fluid, the outlet 133 of the DUT 100 may be exposed to release the fluid to the outside in a state where the distal end surface 321 of the contact chuck 32 contacts the DUT 100.

Figure 8:
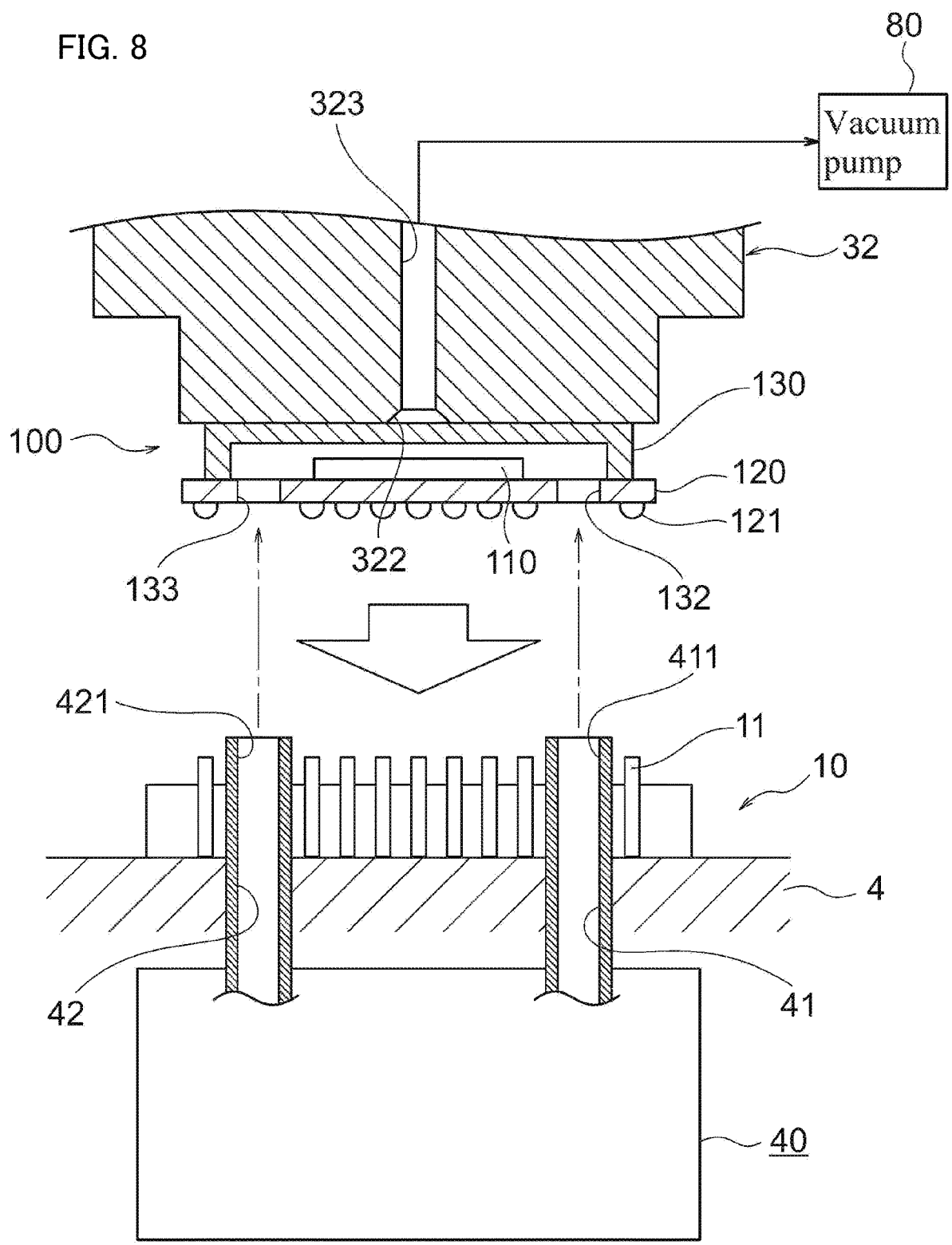
FIG. 8 is a cross-sectional view showing a temperature control device in a second embodiment of the present invention.

Although an example in which the connection ports 411 and 421 connected to the inlet 132 and the outlet 133 of the DUT 100 are arranged in the contact chuck 32 has been described in the above-described embodiment, the connection ports 411 and 421 may be disposed in the socket 10 as shown in FIG. 8. In this case, the inlet 132 and the outlet 133 are formed in the board 120 so as to pass through the board 120. FIG. 8 is a cross-sectional view showing a temperature control device 40 in a second embodiment of the present invention.

Although not shown, while the inlet 132 may be formed in the lid 130 of the DUT 100 and the connection port 411 may be disposed in the contact chuck 32, the outlet 133 may be formed in the board 120 of the DUT 100 and the connection port 421 may be disposed in the socket 10.

Alternatively, while the inlet 132 may be formed in the board 120 of the DUT 100 and the connection port 421 may be disposed in the socket 10, the outlet 133 may be formed in the lid 130 of the DUT 100 and the connection port 411 may be disposed in the contact chuck 32.

An example in which the temperature control device 40 is applied to the handler 20 having the contact arm 30 has been described in the above-described embodiment, however the application of the temperature control device 40 is not particularly limited to this. For example, the above-described temperature control device 40 may be applied to a handler that presses the DUT against a socket in a state where the DUTs are held on a test tray. In this case, the flow holes 41 to 44 are formed in multiple pushers that respectively press the DUTs 100 held on the test tray.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Electronic component test apparatus
2 . . . Tester
10 . . . Socket
20 . . . Handler
30 . . . Contact arm
31 . . . Arm body
32 . . . Contact chuck
324a to 324d . . . Seal ring
40 . . . Temperature control device
41 to 44 . . . Flow hole
411, 421 . . . Connection port
50 . . . Fluid supply system
51 . . . Coolant supply source
52 . . . Hot medium supply source
531 to 538 . . . Pipe
541 to 544 . . . Valve
55 . . . Replenishment tank
60 . . . Purge system
61 . . . Connection part
621, 622 . . . Pipe
631, 632 . . . Valve
64 . . . Pressure sensor
70 . . . Controller
71 . . . Control unit
72 . . . Determination unit
90 . . . Air supply source
100 . . . DUT
110 . . . Die
130 . . . Lid
131 . . . Space
132 . . . Inlet
133 . . . Outlet

What is claimed is:

1. A temperature control device that controls a temperature of a device under test (DUT) in testing the DUT by an electronic component test apparatus, the temperature control device comprising:
   a first flow path that has a first connection port configured to be separably connected to an inlet of a device flow path of the DUT, wherein the device flow path is a space between a board of the DUT and a lid that is attached to the board and covers a die mounted on the board, and the inlet is formed in the board or the lid; and
   a fluid supply system that is connected to the first flow path and supplies a first fluid for temperature control to the device flow path such that the first fluid passes through the device flow path and directly contacts the die.

2. A device under test (DUT) temperature control method for controlling a temperature of a DUT using the temperature control device according to claim 1, the DUT temperature control method comprising:

(a) connecting the first connection port to the inlet of the device flow path; and
(b) supplying the first fluid to the device flow path through the first flow path.

3. A temperature control device that controls a temperature of a device under test (DUT) comprising a device flow path in testing the DUT, the temperature control device comprising:
   a first flow path that has a first connection port to be connected to an inlet of the device flow path;
   a second flow path that has a second connection port to be connected to an outlet of the device flow path;
   a fluid supply system that is connected to the first flow path and supplies a first fluid for temperature control to the device flow path; and
   a purge system that is connected to the first and second flow paths and supplies a second fluid for purge to the device flow path.

4. The temperature control device according to claim 3, wherein
   he fluid supply system comprises:
      a third flow path connected to the first flow path;
      a fourth flow path connected to the second flow path;
      a first valve disposed on the third flow path; and
      a second valve disposed on the fourth flow path,
   the purge system comprises:
      a connection part to which a first supply source that supplies the second fluid is connected;
      a fifth flow path that connects the connection part and the first flow path;
      a sixth flow path connected to the second flow path;
      a third valve disposed on the fifth flow path; and
      a fourth valve disposed on the sixth flow path,
   the fluid supply system opens the first and second valves to supply the first fluid to the device flow path in a state where the third and fourth valves are closed, and
   the purge system opens the third and fourth valves to supply the second fluid to the device flow path in a state where the first and second valves are closed.

5. The temperature control device according to claim 4, wherein
   the sixth flow path is connected to the fluid supply system.

6. The temperature control device according to claim 4, wherein
   at a time when the first and second connection ports move away from the inlet and the outlet, the purge system opens the third valve to supply the second fluid to the device flow path in a state where the first, second, and fourth valves are closed.

7. The temperature control device according to claim 3, further comprising:
   a pressure sensor that detects a pressure value in the first flow path; and
   a controller that determines a first seal state between the inlet and the first connection port and a second seal state between the second connection port and the outlet based on the pressure value.

8. The temperature control device according to claim 7, wherein
   the fluid supply system comprises:
      a third flow path connected to the first flow path;
      a fourth flow path connected to the second flow path;
      a first valve disposed on the third flow path; and
      a second valve disposed on the fourth flow path,
   the purge system comprises:
      a connection part to which a first supply source that supplies the second fluid is connected;
      a fifth flow path that connects the connection part and the first flow path;
      a sixth flow path connected to the second flow path;
      a third valve disposed on the fifth flow path; and
      a fourth valve disposed on the sixth flow path,
   the purge system opens the third valve to supply the second fluid in a state where the first, second, and fourth valves are closed,
   the pressure sensor detects first and second pressure values at different timings after the third valve is closed, and
   the controller determines the first and second seal states based on the first and second pressure values.

9. The temperature control device according to claim 3, wherein
   the fluid supply system comprises:
      multiple first seal rings disposed to surround the first connection port; and
      multiple second seal rings disposed to surround the second connection port.

10. The temperature control device according to claim 3, wherein
    the first fluid includes:
       a third fluid; and
       a fourth fluid having a temperature different from a temperature of the third fluid, and
    the fluid supply system comprises:
       a second supply source that supplies the third fluid; and
       a third supply source that supplies the fourth fluid.

11. An electronic component handling apparatus handling a DUT, the electronic component handling apparatus comprising:
    the temperature control device according to claim 3; and
    a pusher in which the first and second flow paths of the temperature control device are disposed and that contacts and presses the DUT against a socket.

12. The electronic component handling apparatus according to claim 11, wherein the outlet is formed in the lid.

13. An electronic component test apparatus comprising:
    the electronic component handling apparatus according to claim 11; and
    a tester that comprises a socket.

14. A device under test (DUT) temperature control method for controlling a temperature of a DUT using the temperature control device according to claim 3, the DUT temperature control method comprising:
    (a) connecting the first connection port to the inlet of the device flow path;
    (b) supplying the first fluid to the device flow path through the first flow path; and
    (c) supplying the second fluid to the device flow path after stopping the supply of the first fluid.

15. The DUT temperature control method according to claim 14, wherein
    the purge system comprises:
       a connection part to which a first supply source that supplies the second fluid is connected;
       a fifth flow path that connects the connection part and the first flow path;
       a sixth flow path connected to the second flow path;
       a third valve disposed on the fifth flow path; and
       a fourth valve disposed on the sixth flow path, and
    the DUT temperature control method further comprises:
       (d) at a time when the first and second connection ports move away from the inlet and the outlet, opening the third valve to supply the second fluid to the device flow path in a state where the fourth valve is closed.

16. The DUT temperature control method according to claim 14, wherein
the temperature control device comprises a pressure sensor that detects first and second pressure values in the first flow path, and
the DUT temperature control method further comprises:
(e) supplying the second fluid;
(f) detecting the first pressure value after stopping the supply of the second fluid;
(g) detecting the second pressure value after step (f); and
(h) determining a first seal state between the inlet and the first connection port and a second seal state between the second connection port and the outlet based on the first and second pressure values,
steps (e) to (h) are executed before step (b) is executed, and
after determining that the first and second seal states are secured in step (h), step (b) is executed.

* * * * *